US007356782B2

(12) United States Patent
Hsu

(10) Patent No.: US 7,356,782 B2
(45) Date of Patent: Apr. 8, 2008

(54) VOLTAGE REFERENCE SIGNAL CIRCUIT LAYOUT INSIDE MULTI-LAYERED SUBSTRATE

(75) Inventor: Jimmy Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 354 days.

(21) Appl. No.: 11/160,355

(22) Filed: Jun. 21, 2005

(65) Prior Publication Data

US 2005/0235233 A1 Oct. 20, 2005

Related U.S. Application Data

(63) Continuation-in-part of application No. 10/063,737, filed on May 9, 2002, now abandoned.

(30) Foreign Application Priority Data

Feb. 6, 2002 (TW) .............................. 91102057 A

(51) Int. Cl.
*G06F 17/50* (2006.01)

(52) U.S. Cl. .......................................................... 716/1

(58) Field of Classification Search ..................... 716/1
See application file for complete search history.

(56) References Cited

U.S. PATENT DOCUMENTS

| | | | | |
|---|---|---|---|---|
| 5,990,547 | A * | 11/1999 | Sharma et al. | 257/700 |
| 6,111,205 | A * | 8/2000 | Leddige et al. | 174/260 |
| 6,326,244 | B1 * | 12/2001 | Brooks et al. | 438/124 |

* cited by examiner

*Primary Examiner*—Jack Chiang
*Assistant Examiner*—Brandon W. Bowers
(74) *Attorney, Agent, or Firm*—Jianq Chyun IP Office

(57) ABSTRACT

A multi-layered substrate has a voltage reference signal circuit layout therein. A major change in the design of the multi-layered substrate is the moving of a reference signal trace from a signal layer to a non-signaling layer. Once the reference signal trace is moved, the signal traces within the signal layer can have a larger layout area. Similarly, the reference signal trace within the non-signaling layer can have greater layout flexibility in addition to electromagnetic shielding from other signal traces. Moreover, the reference signal trace having a greater width may be used to reduce parasitic resistance within the reference signal circuit.

16 Claims, 10 Drawing Sheets

224
224
204b
204a
204
204b
222
224
224
226
220
228

VOLTAGE REFERENCE SIGNAL CIRCUIT LAYOUT INSIDE MULTI-LAYERED SUBSTRATE

CROSS-REFERENCE TO RELATED APPLICATION

This application is a continuation-in-part of a prior application Ser. No. 10/063,737, filed May 9, 2002 now abandoned. The prior application Ser. No. 10/063,737 claims the priority benefit of Taiwan application serial no. 91102057, filed on Feb. 6, 2002.

BACKGROUND OF THE INVENTION

1. Field of Invention

The present invention relates to a voltage reference circuit layout inside a multi-layered substrate. More particularly, the present invention relates to a multi-layered substrate having a reference signal trace in one of the non-signaling layers.

2. Description of Related Art

In most logic circuit chips or large-scale integrated circuits, a reference signal (V.sub.ref) is often required as a voltage reference standard for determining the voltage level of a logic signal and processing digital signals. More particularly, the logic circuit chip determines a signal at a high level when the signal has a voltage higher than the voltage of the reference signal. On the other hand, the signal is at a low level if the signal has a voltage lower than the voltage of the reference signal. Since accuracy of digital processing depends very much on the reference signal, a constant voltage level provided by the reference signal is always desired. To maintain a constant reference voltage level, coupling of voltage reference with other signals must be minimized. When there is voltage variation in the reference signal due to coupling with surrounding signals, the reference voltage no longer can serve as a standard for gauging the voltage level of other digital logic signals. Consequently, decision regarding logic level is likely to be in error and the entire system may break down. Hence, the maintenance of signal integrity through a reduction in the coupling with external signals is very important.

FIG. 1 is a schematic cross-sectional view of a conventional four-layered substrate. In general, a package substrate or a printed circuit board (PCB) has a four-layered structure. A four-layered substrate 100 is shown in FIG. 1. The four-layered substrate 100 includes a signal layer 104, a ground layer 108, a power layer 112 and another signal layer 116. An insulation layer 106 is formed between the signal layer 104 and the ground layer 108. Similarly, an insulation layer 110 is formed between the ground layer 108 and the power layer 112 and an insulation layer 114 is formed between the power layer 112 and the signal layer 116. In addition, a solder mask layer 102 and another solder mask layer 118 are formed over the signal layer 104 and the signal layer 116 respectively.

Circuits within the signal layer 104 and the signal layer 116 are used for signal inputs/outputs. Furthermore, the signal layers 104 and 116 may be electrically connected through plugs (not shown).

FIG. 2 is a schematic diagram showing a conventional reference signal circuit layout within a signal layer. As shown in FIG. 2, the reference signal circuit layout within the signal layer mainly comprises a reference signal trace and a plurality of signal traces. Using the signal layer 104 above the insulation layer 106 as an example, the reference signal circuit layout within the signal layer 104 mainly comprises a reference signal trace **104*a* and the signal traces 104*b*. The reference signal trace 104*a* and the signal traces 104*b* connect electrically with the signal layer 116 (shown in FIG. 1) through plugs 120. In general, signal transmitting within the reference signal trace 104*a* is frequently affected by signals transmitting within the nearby signal traces 104*b* due to coupling. Consequently, the voltage inside the reference signal trace 104*a*** varies and a standard voltage reference level is hard to maintain.

FIG. 3 is a schematic diagram showing another conventional reference signal circuit layout within a signal layer. The reference signal circuit layout is very similar to the one in FIG. 2. One principle difference is that a double spacing is used between the signal traces **104*b* and the reference signal trace 104*a* so that coupling of the reference signal trace 104*a* with the signal traces 104*b* is lowered. However, the reference signal circuit layout in FIG. 3** still cannot completely eliminate interference due to electromagnetic field. Moreover, a compromise must be made between spatial layout limitation and acceptable degree of coupling.

SUMMARY OF THE INVENTION

Accordingly, one object of the present invention is to provide a multi-layered substrate having a reference signal circuit layout capable of preventing signal coupling between the reference signal trace and other neighboring signal traces.

To achieve these and other advantages and in accordance with the purpose of the invention, as embodied and broadly described herein, the invention provides a multi-layered substrate having a reference signal circuit layout therein. In this invention, the reference signal trace is moved to another non-signaling layer so that the signal traces within the signal layer have larger layout area. The reference signal trace within the non-signaling layer not only is free from signal interference from signal traces, but also has more layout flexibility. In addition, the reference signal circuit may employ a wide conductive trace design so that parasitic resistance is reduced.

The multi-layered substrate according to this invention includes a first signal layer, a plurality of plugs, a ground layer, a power and a second signal layer. The plugs, the ground layer and the power layer are formed between a first signal layer and a second signal layer. The first signal layer comprises a first reference signal trace and a plurality of signal traces. A second reference signal trace is in the power layer or the ground layer (non-signaling layer). The plurality of the plugs are used for electrically connecting the first signal layer and the second signal layer, the first signal layer and the second reference signal circuit, and the second signal layer and the second reference signal circuit The first signal layer, the ground layer, the power layer and the second signal layer separate from each other by dielectric layers. Furthermore, a solder mask layer is formed over the exterior surface of the first signal layer and the second signal layer respectively.

In addition, the multi-layered substrate may also include a signal layer between the ground layer and the power layer, a ground-signal layer between the first signal layer and the ground layer and a power-signal layer between the second signal layer and the power layer.

Depending on the process capability, the reference signal may be transmitted through a plug directly to the second reference signal trace in the non-signaling layer without the first reference signal trace in the signal layer. For example, a flip-chip package IC device can meet this kind of layout design.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
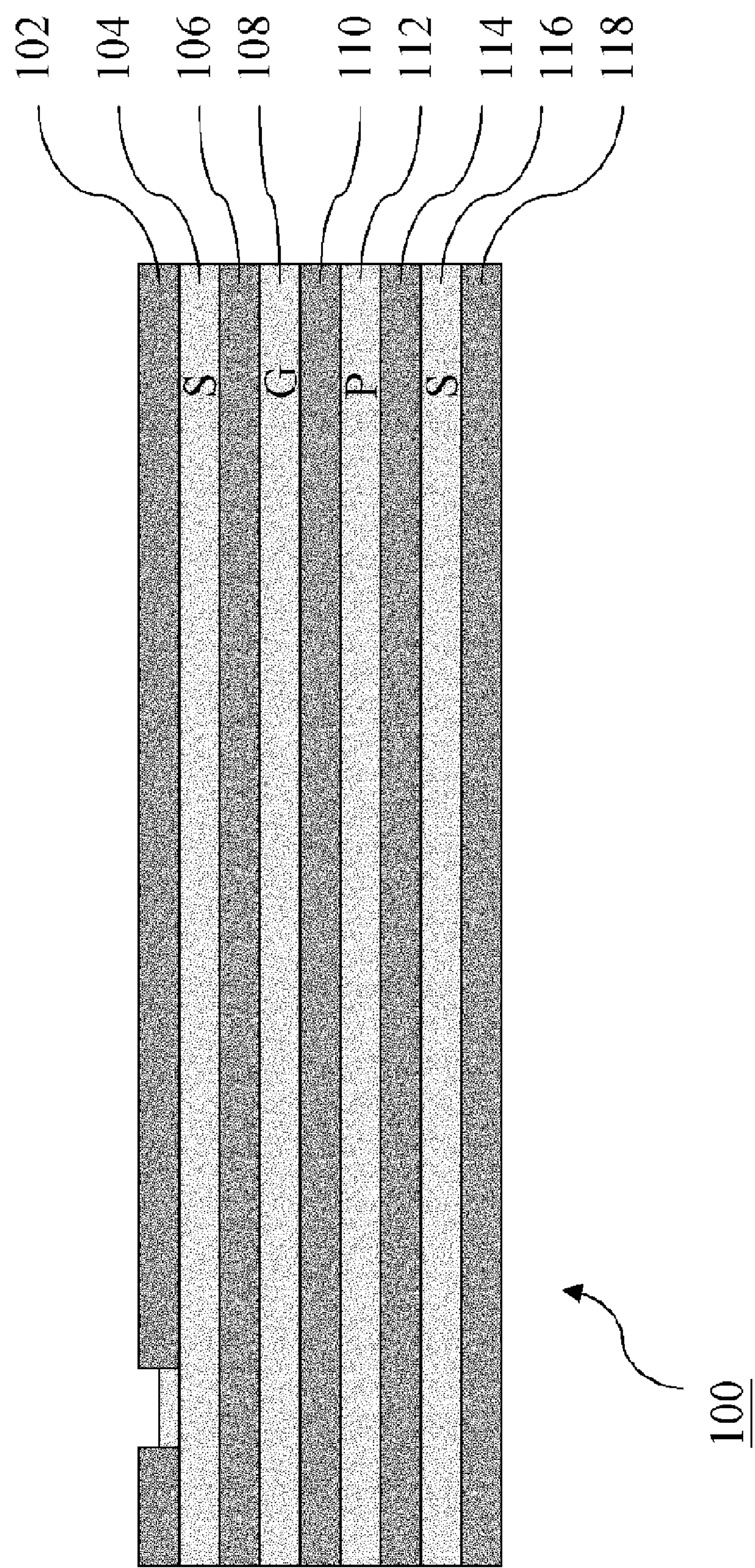
FIG. 1 is a schematic cross-sectional view of a conventional four-layered substrate.
Figure 2:
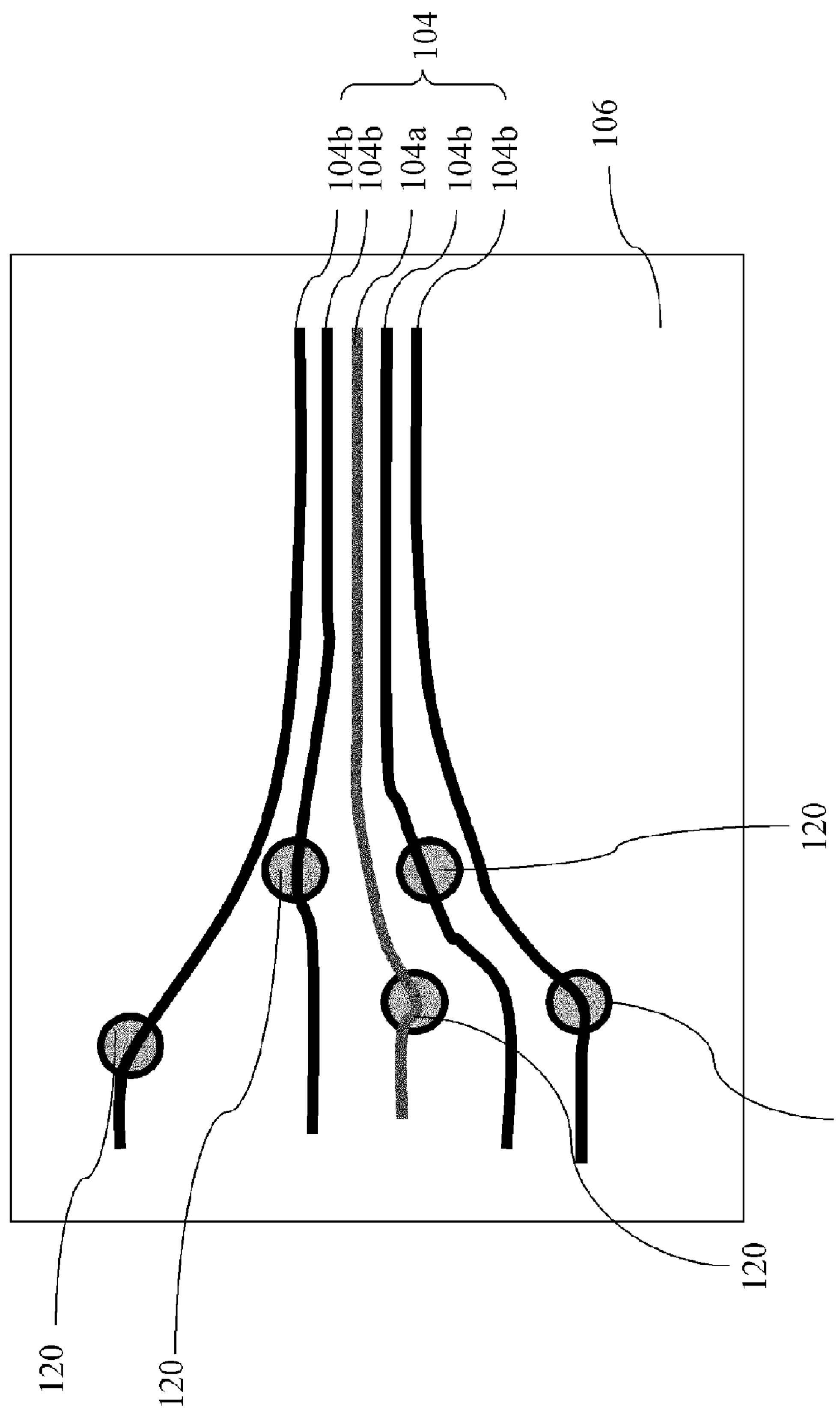
FIG. 2 is a schematic diagram showing a conventional reference signal circuit layout within a signal layer.
Figure 3:
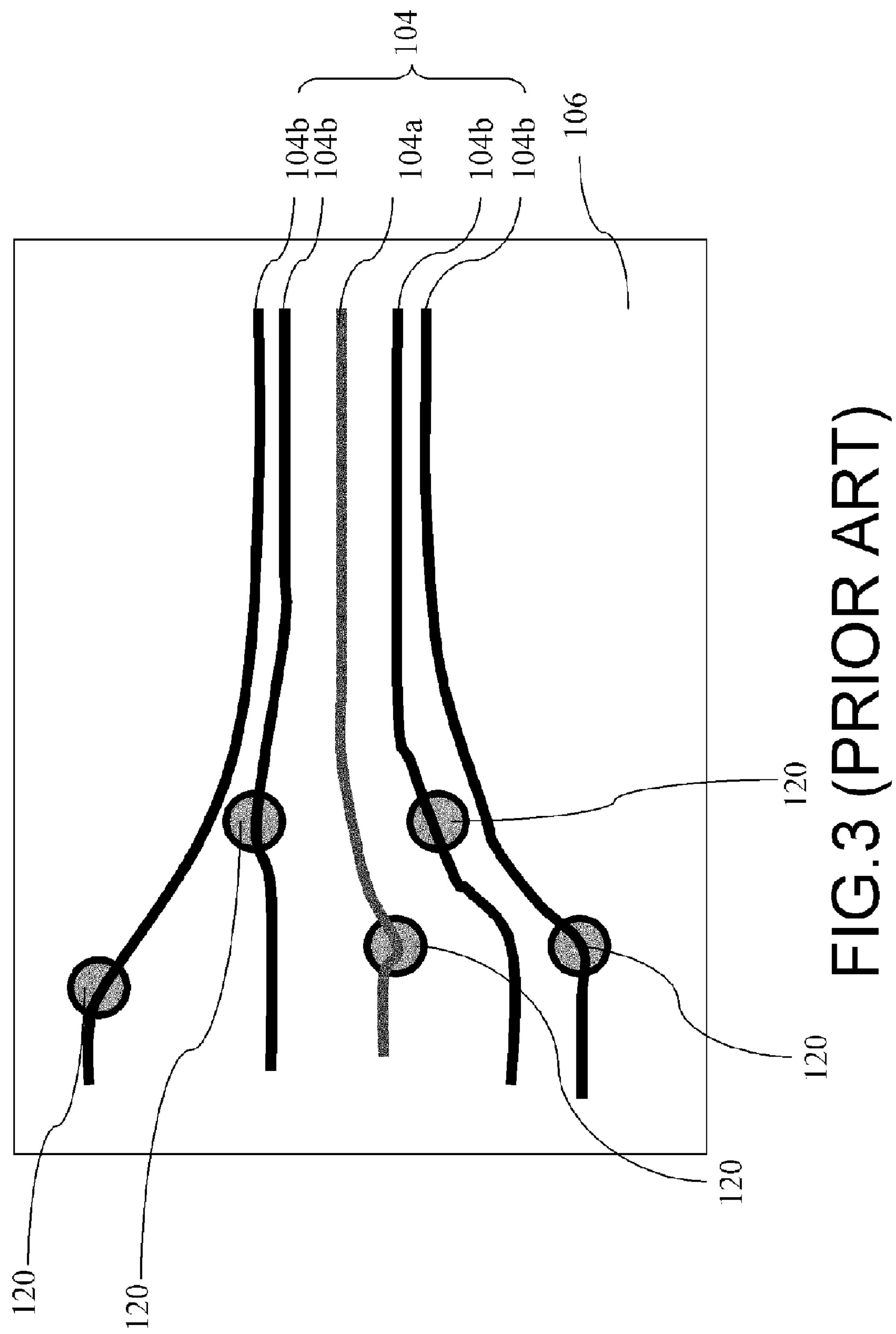
FIG. 3 is a schematic diagram showing another conventional reference signal circuit layout within a signal layer.

Reference will now be made in detail to the present preferred embodiments of the invention, examples of which are illustrated in the accompanying drawings. Wherever possible, the same reference numbers are used in the drawings and the description to refer to the same or like parts.

Figure 4:
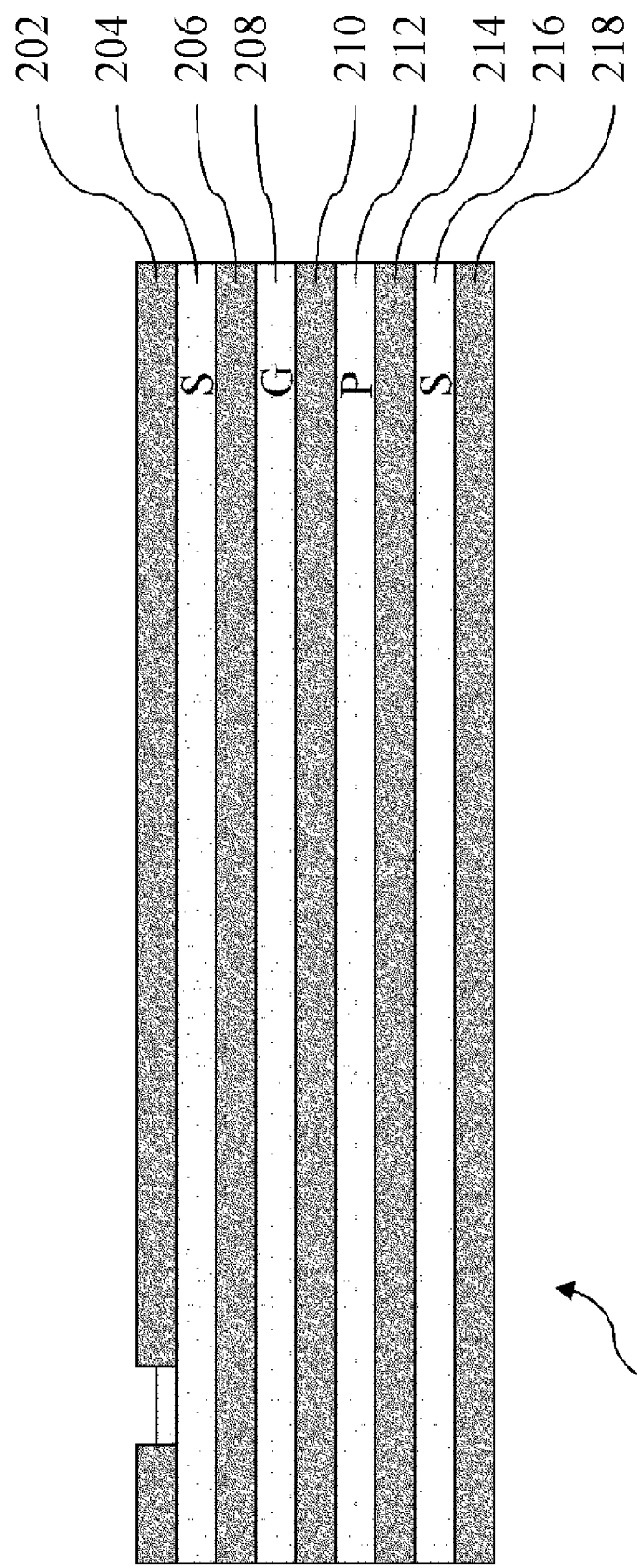
FIG. 4 is a schematic cross-sectional view of a four-layered substrate according to a first preferred embodiment of this invention.

FIG. 4 is a schematic cross-sectional view of a four-layered substrate according to a first preferred embodiment of this invention. Most packaging substrates or printed circuit boards have a four-layered structure. A four-layered substrate 200 is shown in FIG. 4. The four-layered substrate 200 includes a signal layer 204, a ground layer 208, a power layer 212 and another signal layer 216.

An insulation layer 206 separates the signal layer 204 from the ground layer 208. Similarly, an insulation layer 210 separates the ground layer 208 from the power layer 212 and an insulation layer 214 separates the power layer 212 from the signal layer 216. In addition, the exterior surface of the signal layer 204 has a solder mask layer 202 while the exterior surface of the signal layer 216 has another solder mask layer 218.

The circuits within the signal layers 204 and 216 serve as signal input/output channels. In other words, all incoming or outgoing signals will get through either of the signal layers 204 and 216. The signal layers 204 and 216 are electrically connected through plugs (as shown in FIG. 5).

Figure 5:
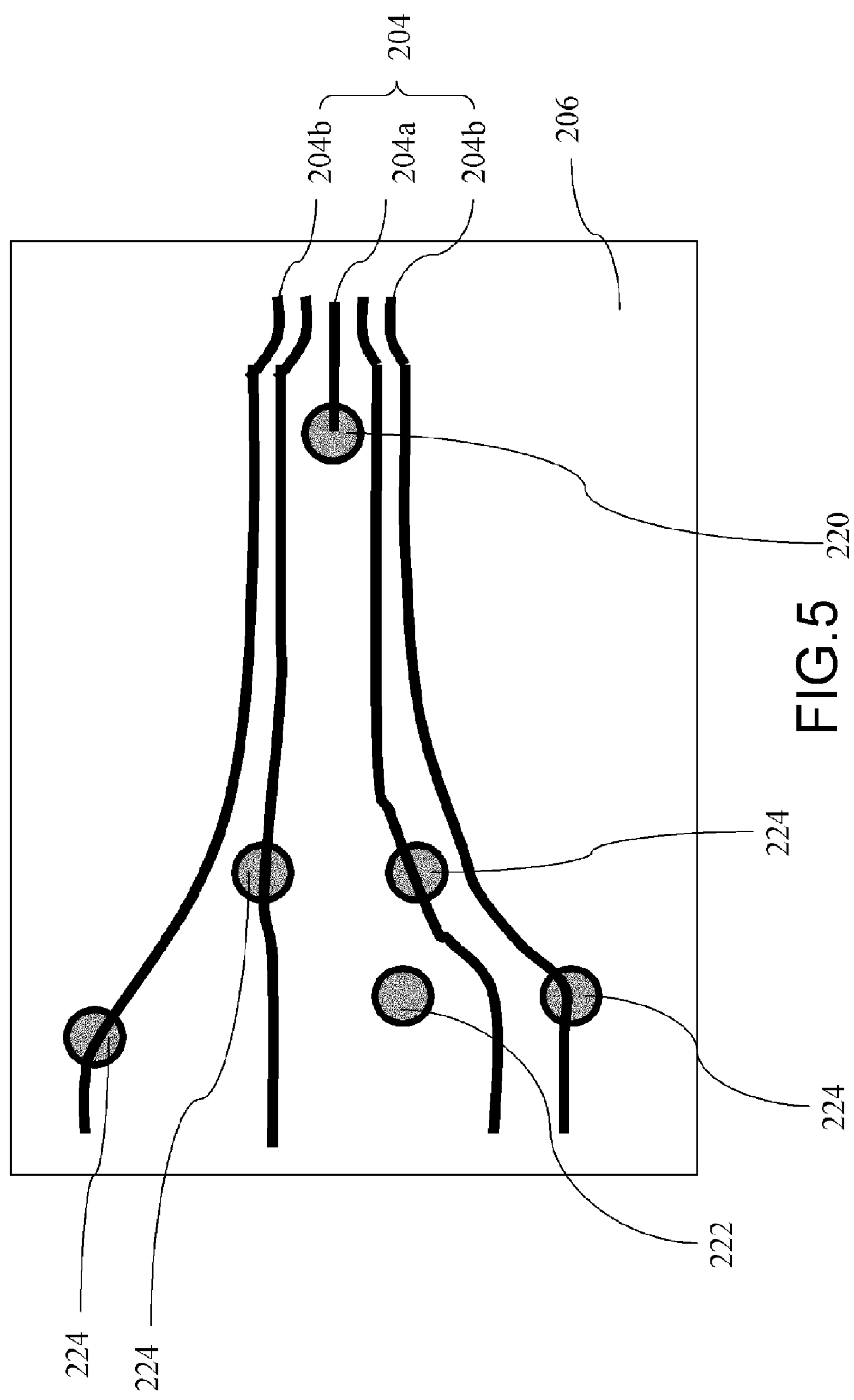
FIG. 5 is a schematic diagram showing a reference signal circuit layout within a signal layer according to the first embodiment of this invention.

FIG. 5 is a schematic diagram showing a reference signal circuit layout within a signal layer according to the first embodiment of this invention. As shown in FIGS. 4 and 5, the traces within the signal layers 204 and 216 mainly comprises a reference signal circuit and signal circuits.

Using the signal layer 204 above the insulation layer 206 as an example, the reference signal circuit layout within the signal layer 204 includes a first reference signal trace 204*a* and a plurality of signal traces 204*b*. One end of the first reference signal trace 204*a* is electrically connected with a plug 220. The other signal traces 204*b* are electrically connected to the signal layer 216 underneath through various plugs 224.

Figure 6:
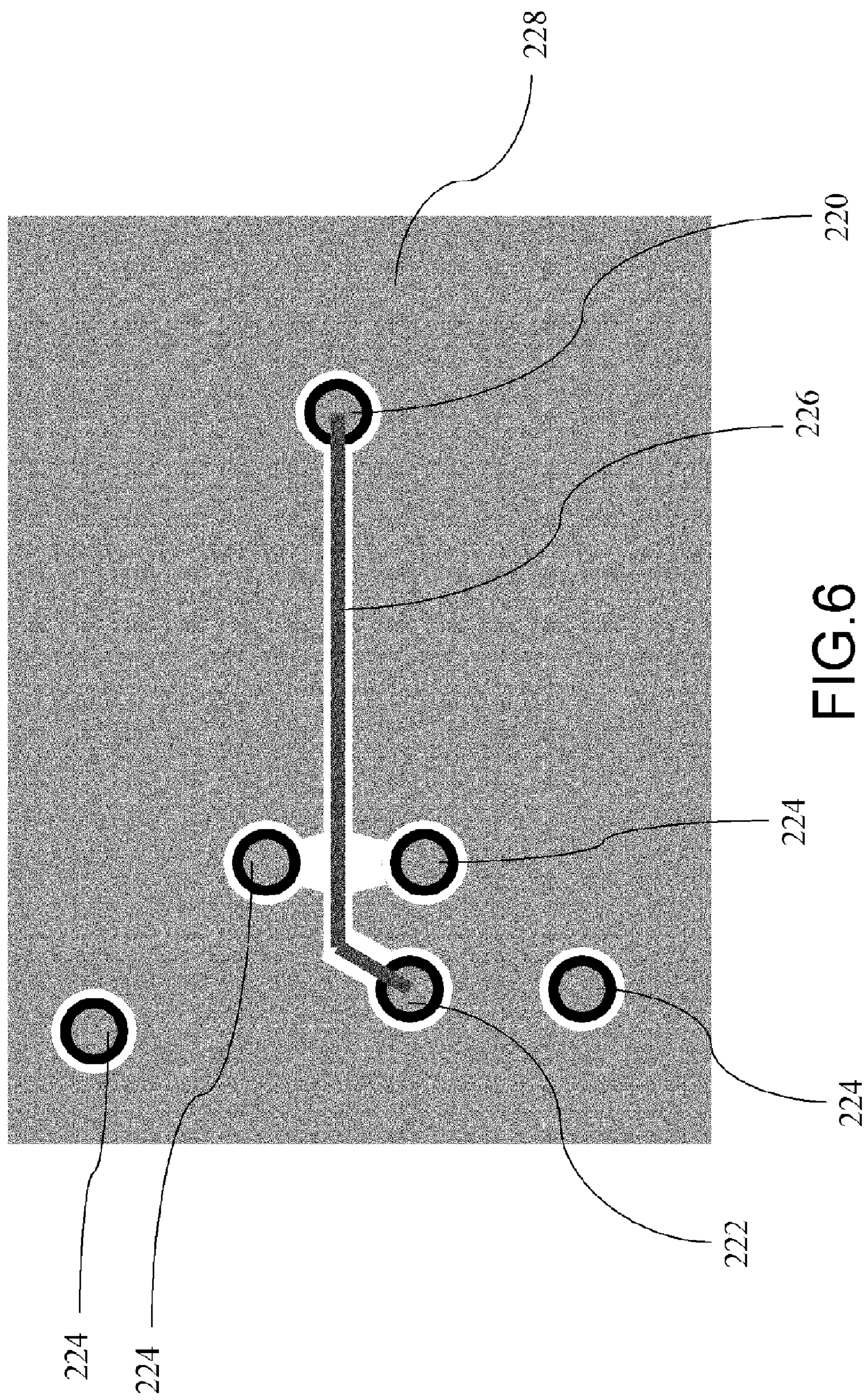
FIG. 6 is a schematic diagram showing a reference signal circuit layout within a power layer according to the first embodiment of this invention.

FIG. 6 is a schematic diagram showing a reference signal circuit layout within a power layer according to the first embodiment of this invention. As shown in FIGS. 4 and 6, the power layer 212 mainly includes a second reference signal trace 226 and a patterned conductive plane 228 for transmitting the reference signal. The terminals of the second reference signal trace 226 are electrically connected a first plug 220 and a second plug 222 respectively. The patterned conductive layer 228 has empty areas surrounding the second reference signal trace 226 as well as the plugs 220, 222 and 224. With this design arrangement, the patterned conductive layer 228 is less vulnerable to short circuiting with the second reference signal trace 226 and various plugs 220, 222, 224. Anyone familiar with such technologies may also notice that in places corresponding to the plugs 220, 222 and 224 within the ground layer 208 between the signal layer 204 and the power layer 212 also have empty areas to facilitate the positioning of the plugs.

Each of the plugs 220, 222 and 224 within the four-layered substrate 200 has a special function. For example, the plug 220 connects the first reference signal trace 204*a* and the second reference signal trace 226 electrically. Similarly, the plug 222 connects the second reference signal trace 226 and the signal layer 216 electrically and the plug 224 connects the signal layer 204 and the signal layer 216 electrically.

Figure 7:
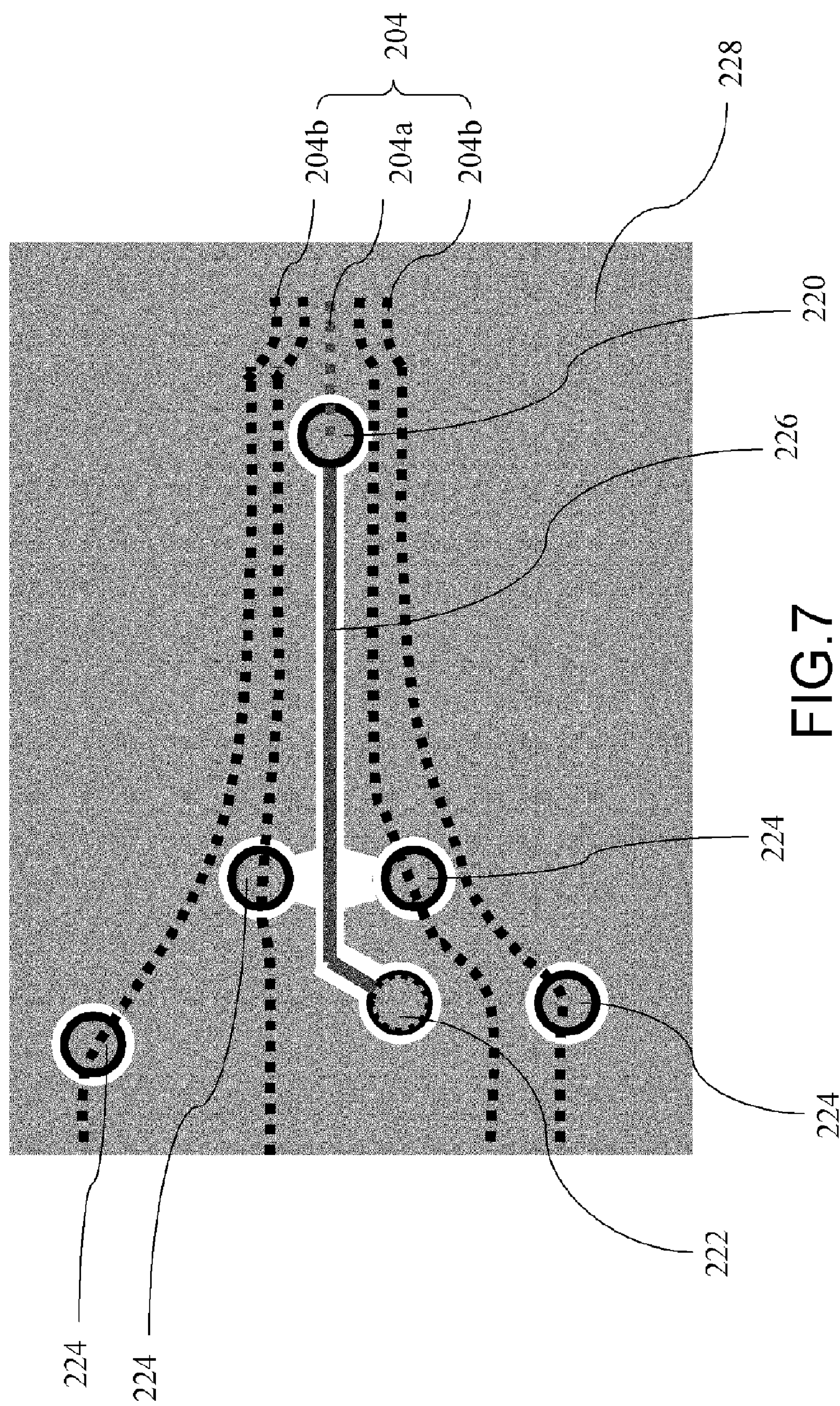
FIG. 7 is a schematic diagram showing a reference signal circuit layout after the signal layer and the power layer stacked together according to the first embodiment.

FIG. 7 is a schematic diagram showing a reference signal circuit layout after the signal layer and the power layer stacked together according to the first embodiment. As shown in FIGS. 4 and 7, one end of the second reference signal trace 226 and the first reference signal trace 204*a* are electrically connected through the plug 220 after the signal layer 204 and the power layer 212 stacked together. Similarly, the other end of the second reference signal trace 226 and the signal layer 216 underneath are electrically connected through the plug 222.

The first reference signal trace 204*a* and the second reference signal trace 226 together form a complete reference signal circuit. Since the second reference signal trace 226 is formed within the power layer 212, the ground layer 208 between the power layer 212 and the signal layer 204 functions as an electromagnetic shield reducing any signal coupling between the reference signal circuit and other signal circuits. Ultimately, a constant voltage level is maintained within the reference signal trace 204*a*.

The reference signal trace within the signal layer 204 is moved to the power layer 212 so that the signal traces 204*b* within the signal layer 204 can have a larger space for wiring layout. Consequently, the second reference signal trace 226 can have more layout flexibility. Furthermore, a wider conductive line may be employed in the second reference signal trace 226 to reduce parasitic resistance.

Anyone familiar with the technologies may notice that moving the reference signal trace within the signal layer 204 to the ground layer 208 is also a feasible alternative. This arrangement similarly increases area for accommodating the signal traces 204*b* and provides more flexibility to the layout of reference signal circuit.

Figure 8:
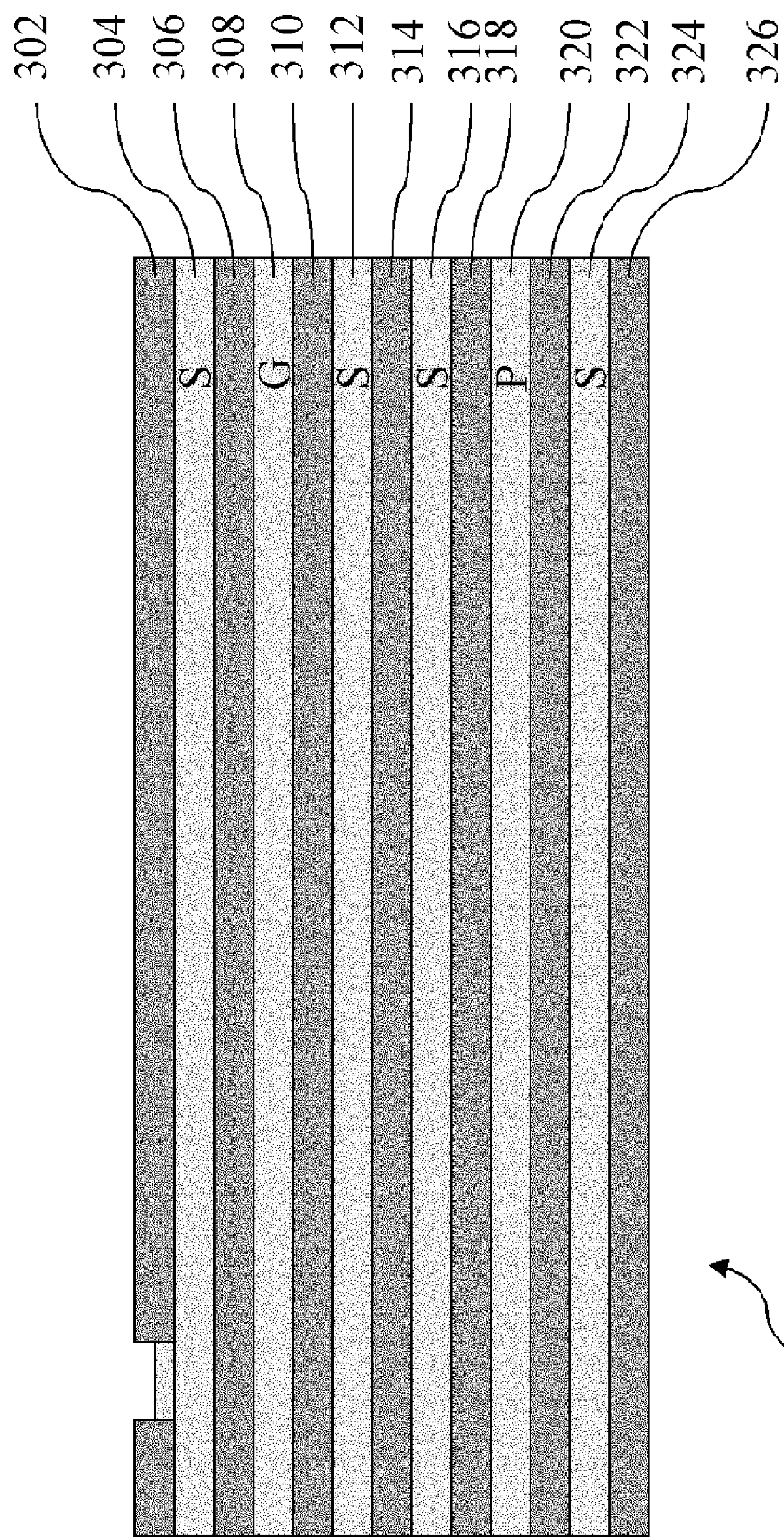
FIG. 8 is a schematic cross-sectional view of a multi-layered substrate according to a second preferred embodiment of this invention.

FIG. 8 is a schematic cross-sectional view of a multi-layered substrate according to a second preferred embodiment of this invention. The reference signal circuit layout according to this invention has applications in other types of multi-layered substrate aside from a four-layered substrate. As shown in FIG. 8, the multi-layered substrate 300 comprises a signal layer 304, a ground layer 308, a second signal layer 312, a third signal layer 316, a power layer 320 and a fourth signal layer 324. An insulation layer 306 separates the signal layer 304 and the ground layer 308. Similarly, an insulation layer 310 separates the ground layer 308 and the second signal layer 312, an insulation layer 314 separates the second signal layer 312 and the third signal layer 316, an insulation layer 318 separates the third signal layer 316 and the power layer 320, and an insulation layer 322 separates the power layer 320 and the fourth signal layer 324. In addition, a solder mask layer 302 is formed on the exterior surface of the signal layer 304 and another solder mask layer 326 is formed on the exterior surface of the fourth signal layer 324.

In the second embodiment, the reference signal trace within the signal layer 304 may move to either the ground layer 308 or the power layer 320. This arrangement similarly prevents signal coupling and increases layout flexibility.

Figure 9:
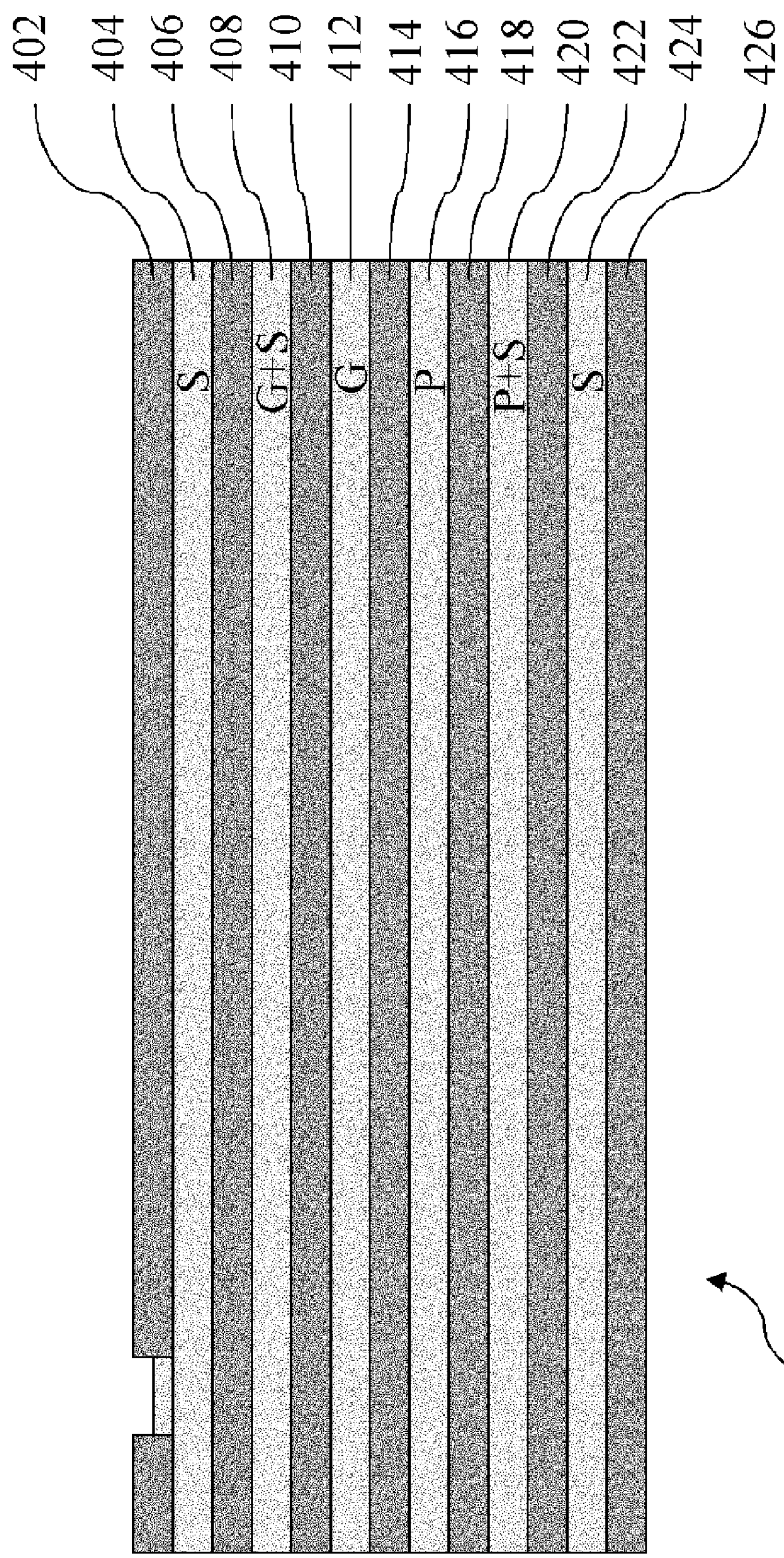
FIG. 9 is a schematic cross-sectional view of a multi-layered substrate according to a third preferred embodiment of this invention.

FIG. 9 is a schematic cross-sectional view of a multi-layered substrate according to a third preferred embodiment of this invention. As shown in FIG. 9, the multi-layered substrate 400 comprises a signal layer 404, a ground-signal layer 408, a ground layer 412, a power layer 416, a power-signal layer 420 and a second signal layer 424. An insulation layer 406 separates the signal layer 404 and the ground-signal layer 408. Similarly, an insulation layer 410 separates the ground-signal layer 408 and the ground layer 412, an insulation layer 414 separates the ground layer 412 and the power layer 416, an insulation layer 418 separates the power layer 416 and the power-signal layer 420, and an insulation layer 422 separates the power-signal layer 420 and the second signal layer 424. In addition, a solder mask layer 402 is formed on the exterior surface of the signal layer 404 and another solder mask layer 426 is formed on the exterior surface of the second signal layer 424.

In the third embodiment, the reference signal circuit within the signal layer 404 may move to the ground-signal layer 408, the ground layer 412, the power layer 416 or the power-signal layer 420. This arrangement similarly prevents signal coupling and increases layout flexibility.

Figure 10:
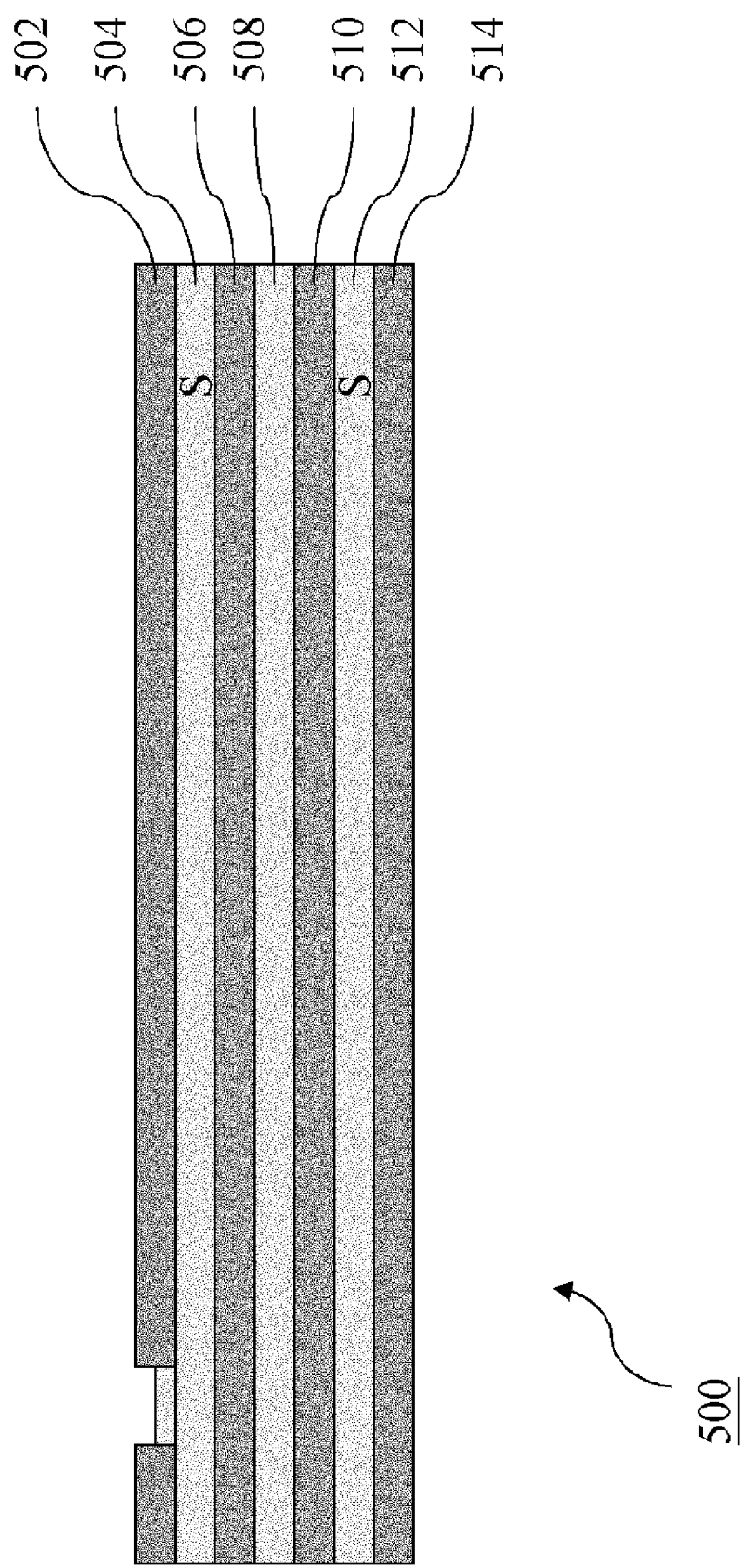
FIG. 10 is a schematic cross-sectional view of a multi-layered substrate according to a fourth preferred embodiment of this invention.

FIG. 10 is a schematic cross-sectional view of a multi-layered substrate according to a fourth preferred embodiment of this invention. As shown in FIG. 10, the multi-layered substrate 500 comprises a signal layer 504, a non-signaling layer 508 and a second signal layer 512. An insulation layer 506 separates the signal layer 504 and the non-signaling layer 508 and, an insulation layer 510 separates the non-signaling layer 508 and the second signal layer 512. In addition, a solder mask layer 502 is formed on the exterior surface of the signal layer 504 and another solder mask layer 514 is formed on the exterior surface of the second signal layer 512.

In the fourth embodiment, the reference signal circuit within the signal layer 504 may move to the non-signaling layer 508. This arrangement similarly prevents signal coupling and increases layout flexibility.

In conclusion, the multi-layered substrate having a reference signal circuit layout therein according to this invention has at least the following advantages:

1. The conductive plane in the ground layer is an electromagnetic shield for the reference signal circuit that prevents the coupling of other signal circuits with the reference signal circuit.

2. The reference signal circuit is formed in a conductive layer outside the signal layer so that the reference signal circuit can have more layout flexibility.

3. Since the reference signal circuit is formed in a conductive layer outside the signal layer, other signal circuits within the signal layer can have a larger layout area.

4. Because the reference signal circuit is formed in a conductive layer outside the signal layer, the conductive trace having a larger width may be employed to form the reference signal circuit so that effective parasitic resistance is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-layered substrate, comprising:

a non-signaling layer having a reference signal trace; and a signal layer having at least one signal trace providing a signal, wherein the reference signal trace provides a reference signal for determining a voltage level of the signal, and the reference signal trace is wider than the signal trace.

2. The multi-layered substrate of claim 1, wherein the non-signaling layer includes at least one power plane.

3. The multi-layered substrate of claim 1, wherein the non-signaling layer includes at least one ground plane.

4. The multi-layered substrate of claim 1, wherein the non-signaling layer includes a least one power plane and a plurality of signal trace.

5. The multi-layered substrate of claim 1, wherein the non-signaling layer includes at least one ground plane and a plurality of signal trace.

6. The multi-layered substrate of claim 1, wherein the reference signal trace provides a constant voltage.

7. The multi-layered substrate of claim 1, wherein the signal is a logic signal.

8. A multi-layered substrate, comprising:

a non-signaling layer having a reference signal trace;

a signal layer having at least one signal trace providing a signal; and a conductive plane between the signal layer and the non-signaling layer, wherein the reference signal trace provides a reference signal for determining a voltage level of the signal, and the reference signal trace is wider than the signal trace.

9. The multi-layered substrate of claim 8, wherein the non-signaling layer includes at least one power plane.

10. The multi-layered substrate of claim 8, wherein the non-signaling layer includes at least one ground plane.

11. The multi-layered substrate of claim 8, wherein the non-signaling layer includes at least one power plane and a plurality of signal trace.

12. The multi-layered substrate of claim 8, wherein the non-signaling layer includes at least one ground plane and a plurality of signal trace.

13. The multi-layered substrate of claim 8, wherein the conductive plane includes at least one power plane.

14. The multi-layered substrate of claim 8, wherein the conductive plane includes at least one ground plane.

15. The multi-layered substrate of claim 8, wherein the reference signal trace provides a constant voltage.

16. The multi-layered substrate of claim 8, wherein the signal is a logic signal.

* * * * *